United States Patent
Kimura

[11] Patent Number: 6,011,306
[45] Date of Patent: Jan. 4, 2000

[54] SEMICONDUCTOR DEVICE AND METHOD FOR FABRICATING SAME

[75] Inventor: Naoto Kimura, Kumamoto, Japan

[73] Assignee: NEC Corporation, Tokyo, Japan

[21] Appl. No.: 09/157,474

[22] Filed: Sep. 21, 1998

[30] Foreign Application Priority Data

Sep. 22, 1997 [JP] Japan .................................. 9-256988

[51] Int. Cl.[7] .................................................. H01L 23/48
[52] U.S. Cl. ......................... 257/738; 257/690; 257/779; 257/734
[58] Field of Search .................................... 257/690–697, 257/737, 738, 780, 781, 777–779, 734

[56] References Cited

U.S. PATENT DOCUMENTS

| | | | |
|---|---|---|---|
| 5,521,435 | 5/1996 | Mizukoshi | 257/738 |
| 5,535,101 | 7/1996 | Miles et al. | 257/686 |
| 5,659,952 | 8/1997 | Kovac et al. | 257/668 |
| 5,674,785 | 10/1997 | Akram et al. | 438/15 |
| 5,770,479 | 6/1998 | Brooks et al. | 438/123 |
| 5,834,339 | 11/1998 | Distefano et al. | 438/125 |

*Primary Examiner*—Tom Thomas
*Assistant Examiner*—Ori Nadav
*Attorney, Agent, or Firm*—Young & Thompson

[57] ABSTRACT

A pad on a semiconductor chip is connected to a solder ball, which communicates with an external circuit, without using a lead, thereby increasing the degree of freedom of bonding, and miniaturizing the semiconductor device. An insulative shaft provided with conductive parts on its surface is attached to the semiconductor chip generally parallel to the surface of the chip. The pad on the chip is connected to the conductove part of the insulator shaft via a bonding wire, and the solder ball is joined to the conductive part.

15 Claims, 6 Drawing Sheets

7 INSULATIVE RESIN SHAFT

11 RESIST

12 BASE METAL-COATED PART

13 SOLDER-PLATED LAYER

RESIST IS REMOVED

SEMICONDUCTOR DEVICE AND METHOD FOR FABRICATING SAME

FIELD OF THE INVENTION

The invention relates to a semiconductor device and a method for fabricating the same, and especially to a molded ball grid array (BGA) semiconductor device of a lead on chip (LOC) type and a method for fabricating the same.

BACKGROUND OF THE INVENTION

In a conventional BGA semiconductor device of a LOC type, leads are stuck to a semiconductor chip via insulative adhesive tapes, and the leads and pads formed on the semiconductor chip are connected by bonding wires. However, in case that the semiconductor chip is miniaturized or provided with many pins, spacing between the adjacent leads become narrow, so that it becomes impossible to connect the leads and the pads by a wire-bonding apparatus. Accordingly, it is extremely desirable to develop a semiconductor device, in which the leads and pads can be connected without using the leads, which have been an obstacle to miniaturization of the semiconductor device.

Accordingly, it is an object of the invention to solve these problems and provide a semiconductor device, in which leads are unnecessary in conformity with the recent tendency that a semiconductor chip is being miniaturized and the number of pins thereof is increasing.

It is a further object of the invention to solve these problems and provide a method for fabricating a semiconductor device, in which leads are unnecessary in conformity with the recent tendency that a semiconductor chip is being miniaturized and the number of pins thereof is increasing.

According to the first feature of the invention, a semiconductor device comprises:

insulative members partially covered with conductive parts and stuck to a semiconductor chip, bonding wires for connecting pads formed on the semiconductor chip with the conductive parts, and external terminals connected with the conductive parts.

According to the second feature of the invention, a method for fabricating a semiconductor device comprises the steps of:

sticking insulative members partially covered with conductive parts to a semiconductor chip, connecting pads formed on the semiconductor chip with the conductive parts by bonding wires, and connecting the conductive layers with external terminals.

DESCRIPTION OF THE DRAWINGS

The invention will be explained in more detail in conjunction with appended drawings wherein.

DESCRIPTION OF THE PREFERRED EMBODIMENTS

Before explaining a semiconductor device and a method for fabricating the same in preferred embodiments of the invention, an aforementioned conventional semiconductor device will be explained.

Figure 1:
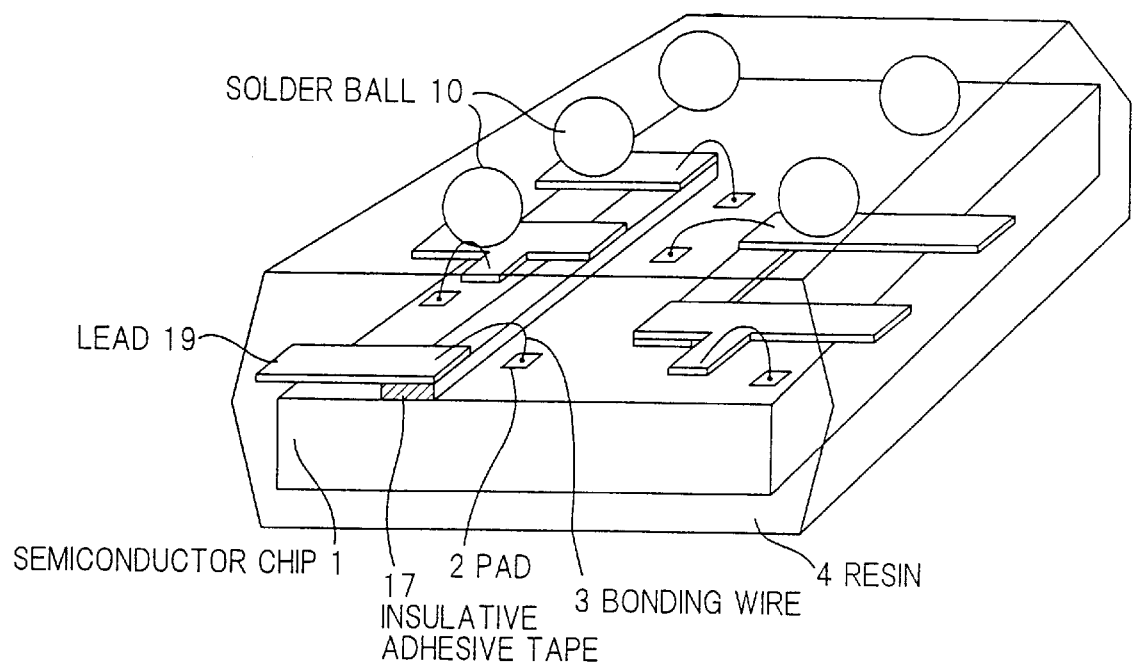
FIG. 1 is a perspective view for showing a conventional semiconductor device.

As shown in a perspective view of FIG. 1, in a conventional BGA semiconductor device of a LOC type, a lead 19 is joined with the top surface of a semiconductor chip 1 by an adhesive insulative tape 17, and both the ends of a bonding wire 3 are bonded with a pad 2 formed on the semiconductor chip 1 and the end of the lead 19. After the semiconductor chip 1 comprising the bonding wires 3 is sealeded by molded resin 4, solder balls 10 are set on the leads 19, and the semiconductor device is completed in this way. The bonding wire 3 starts from the pad 2, is bent upward, and its end is bonded with the lead 19 obliquely.

In the aforementioned conventional semiconductor device, when the semiconductor chip is small-sized or provided with many pins, the lead 19 is connected with a lead frame, a spacing between the adjacent leads becomes extremely small, and it becomes difficult to insert the capillary of a wire-bonding apparatus at the time of bonding, hence wire-bonding becomes impossible.

Figure 2A:
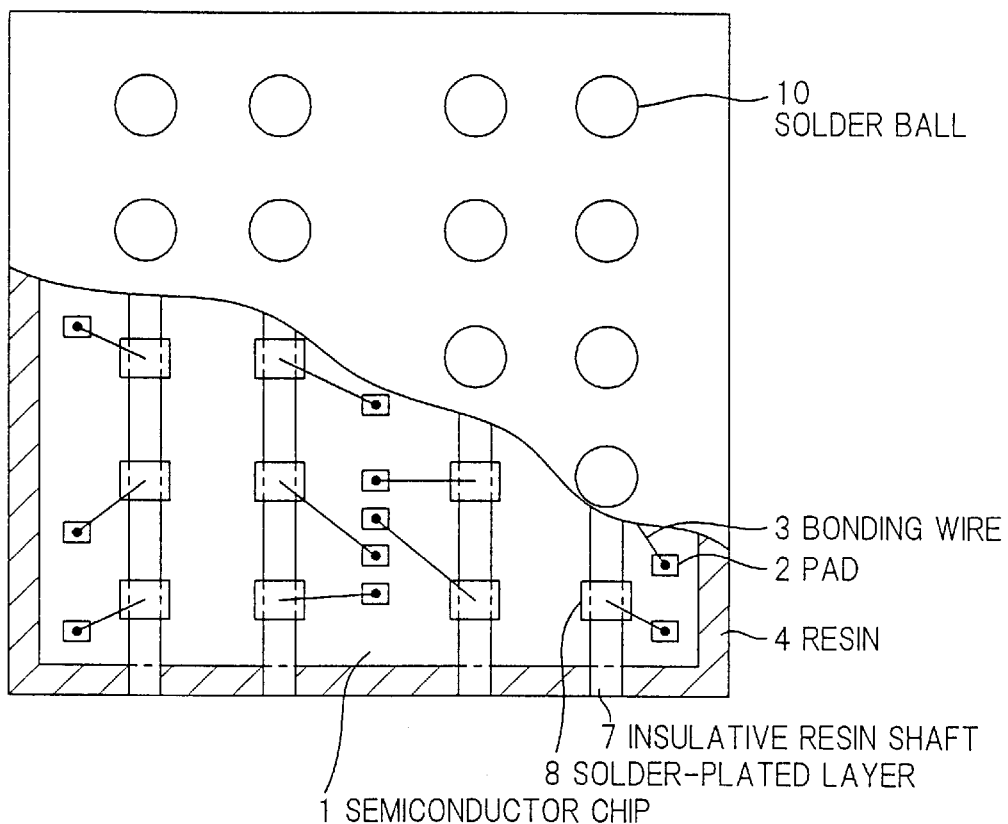
FIGS. 2A and 2B are respectively a top view and a cross-sectional view for explaining the first preferred embodiment of the invention.
Figure 2B:
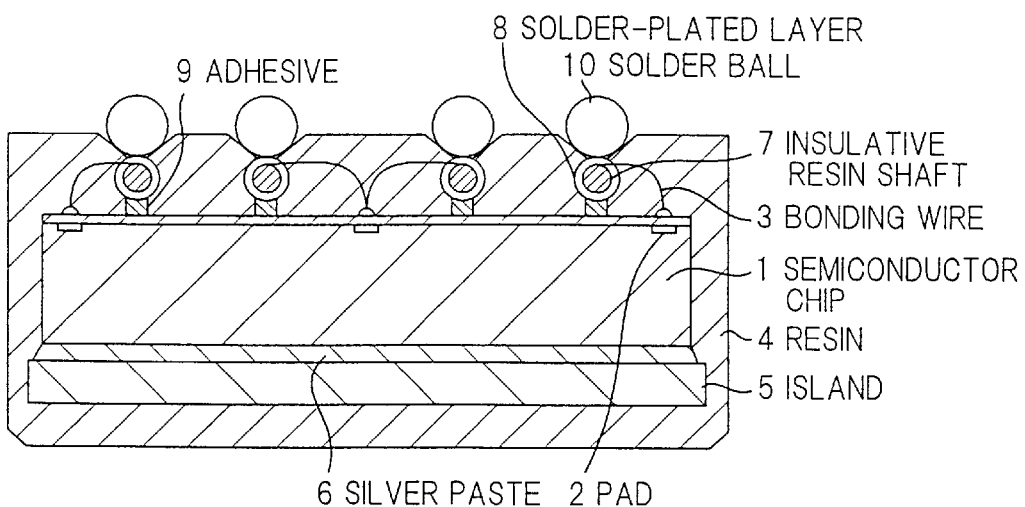

Next, the embodiments of the invention will be explained referring to the appended drawings. FIGS. 2A and 2B respectively show the top and cross-sectional views of a semiconductor device according to the first preferred embodiment of the invention, in which an insulative resin shaft is used instead of leads, the surface of the insulative resin shaft 7 is covered with plural solder-plated layers (conductive parts) 8 with a low melting point. In FIG.2A, a semiconductor chip 1 is joined with the island 5 by silver paste 6, which serves as an adhesive. A bonding wire 3 starting from a pad 2 formed on the semiconductor chip 1 is joined with the solder-plated layer 8, and thereafter the semiconductor chip 1 is sealed by sealing resin 4. Then, a solder ball 10 is set on a portion corresponding to the solder-plated layer 8 on the insulative shaft 7 and joined therewith.

Figure 3A:
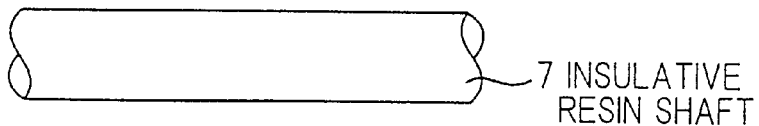
FIGS. 3A to 3E are side views for explaining a process of fabrication of an insulative resin shaft used in the first preferred embodiment of the invention.
Figure 3B:
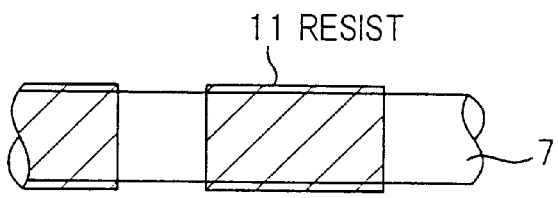
Figure 3C:
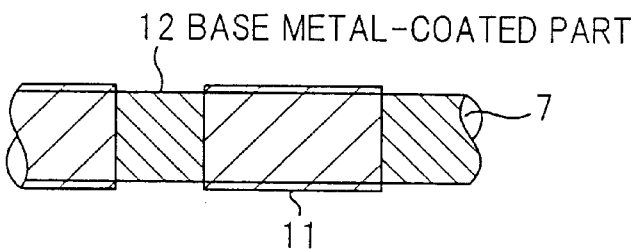
Figure 3D:
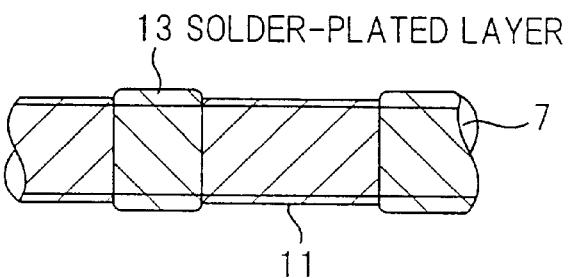
Figure 3E:
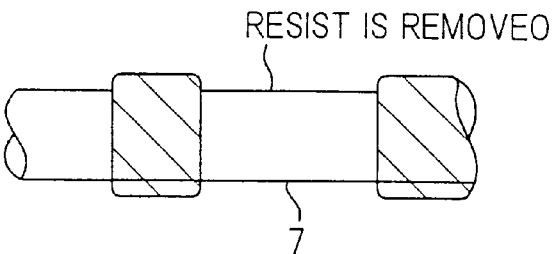
Figure 4A:
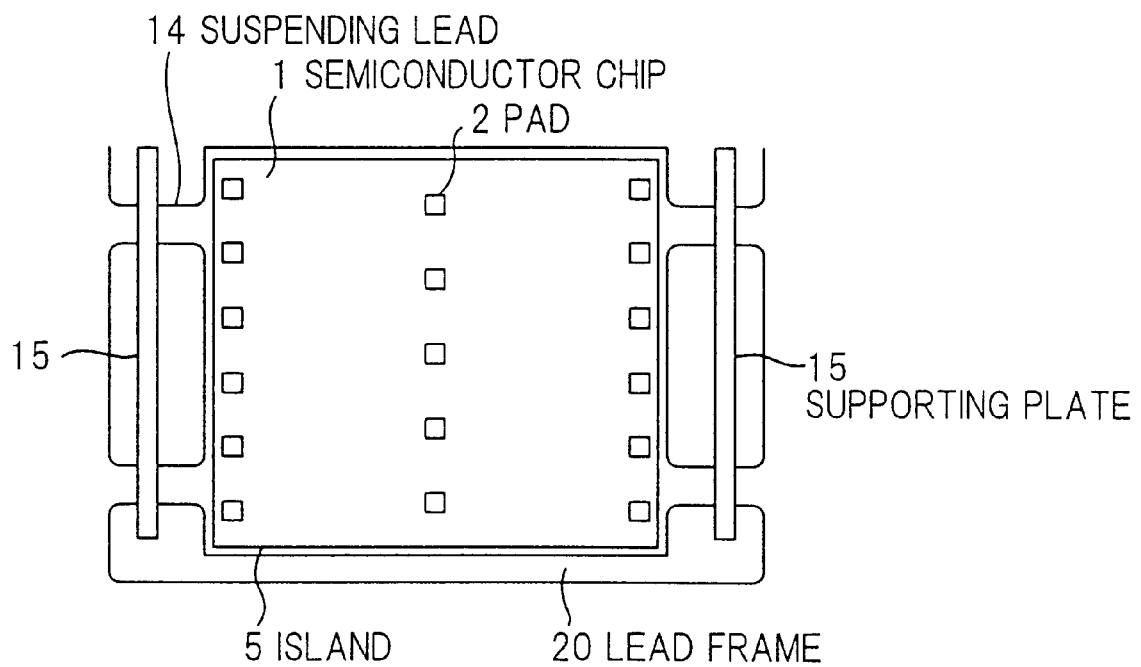
FIGS. 4A and 4B are respectively a top view and a cross-sectional view for explaining a process of fabrication of the first preferred embodiment of the invention.
Figure 4B:
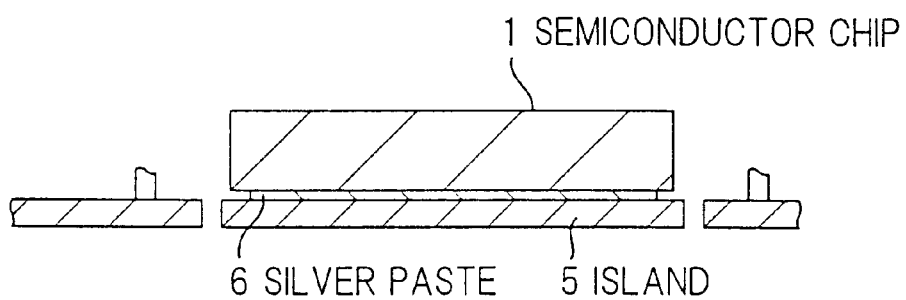

The insulative resin shaft with the solder-plated layers is fabricated as shown in cross-sectional views FIGS. 3A to 3E, which are shown following the sequence of process. First, as shown in FIG.3A, insulative resin is formed into a shaft 7 with cylindrical configuration. The cross-section of the shaft may be square. Next, as shown in FIG.3B, resists 11 are applied to parts, where the solder-plated layers are not to be formed. Next, as shown in FIG. 3C, Pd, which serves as base metal of plating, is coated on base metal-coated parts 12 by evaporation. Next, as shown in FIG. 3D, the solder-plated layer 13 are formed by electroless plating, and as shown in FIG. 3E, the resists 11 are removed. Then, the solder-plated layers 13 are left behind.

Next, a method for fabricating a semiconductor device according to the invention will be explained referring to FIGS. 4A to 4B and FIGS. 5A to 5B. As shown in a top view of FIG. 4A and a cross-sectional view of FIG. 4B, suspending leads 14, which are on both the sides (left and light) of an island 5 of a lead frame 20, are respectively provided with supporting plates 15, which are vertical to the suspending leads 14. A semiconductor chip 1 is joined with the island 5 by silver paste 6.

Figure 5A:
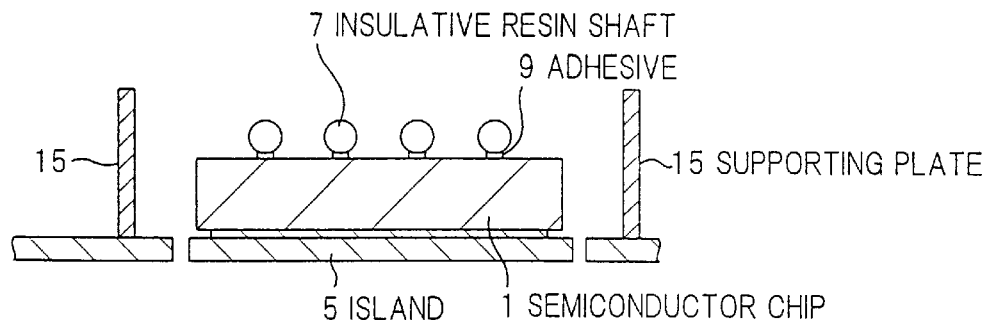
FIGS. 5A to 5D are cross-sectional views for explaining a process of fabrication of the first preferred embodiment of the invention.
Figure 5B:
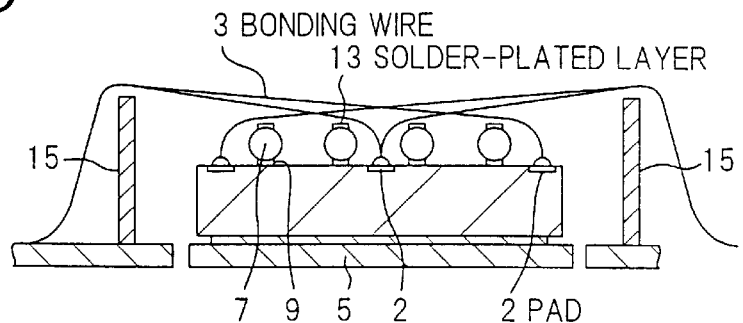
Figure 5C:
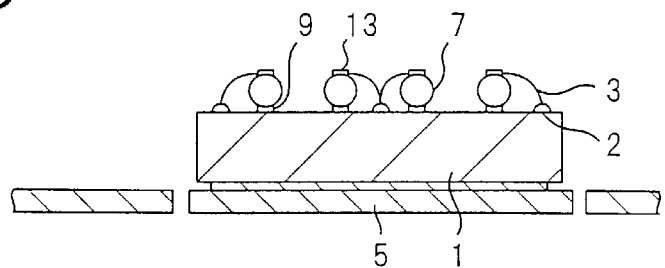
Figure 5D:
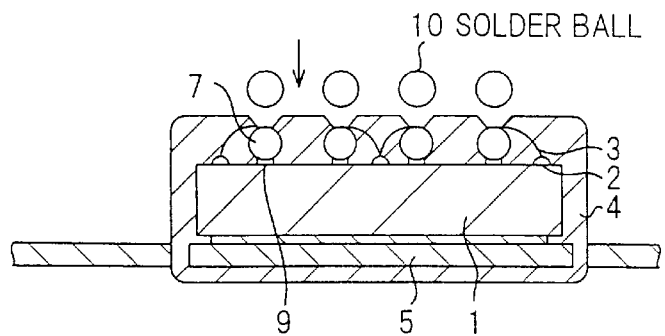

Next, as shown in FIG. 5A, an insulative resin shaft 7, which is fabricated by a process shown in FIGS. 3A to 3E, is adhered to the semiconductor chip 1 by insulative adhesive 9. Moreover, as shown in FIG. 5B, a bonding wire 3 is from a pad 2 on the semiconductor chip 1 to the supporting plate 15 via the insulative resin shaft 7, and the pad 2 and a solder-plated layer 13 are connected with the bonding wire 3. Then, as shown in FIG. 5C, the bonding wire 3 is cut at the edge of the solder-plated layer 13, and the supporting plate 15 is taken off. Then, as shown in FIG. 5D, the semiconductor chip 1 having the bonding wires 3 connected therewith is sealed by resin 4, the solder ball 10 is set at a portion corresponding to the solder-plated layer 13 and joined therewith.

As mentioned in the above, according to the embodiment of the invention, it becomes possible to interconnect the pad 2 with the solder ball 10 via bonding wire 3, without using the lead, by making the insulative resin shaft 7 provided with the solder-plated layers 13 lie between the pad 2 and the solder ball 10, and miniaturize the semiconductor device.

Figure 6A:
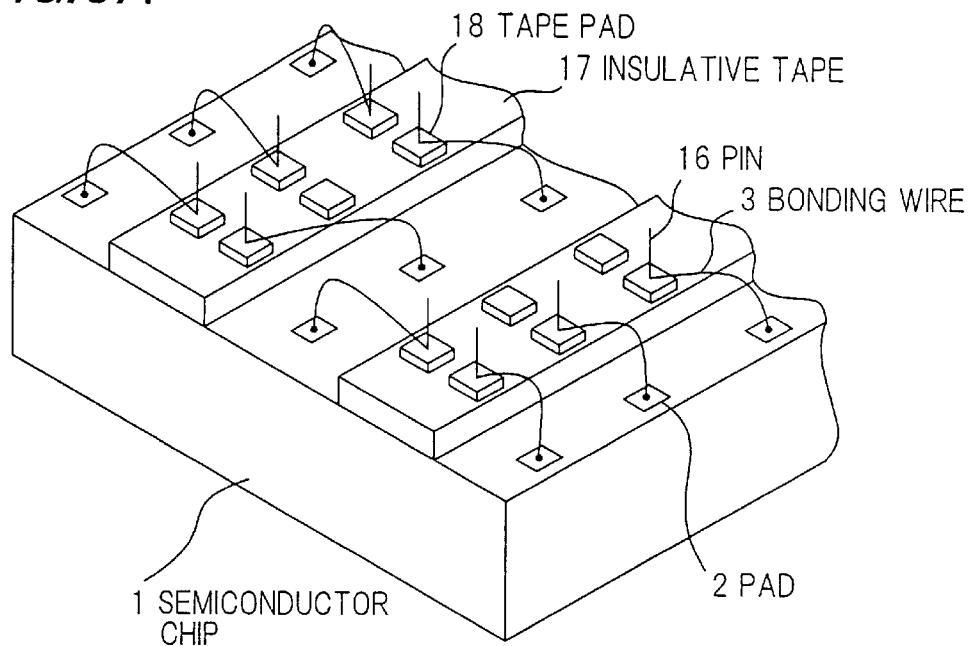
FIGS. 6A to 6B are respectively a perspective view and a cross-sectional view for explaining the second preferred embodiment of the innovation, and, FIG.7 is a cross-sectional view for explaining the third preferred embodiment of the invention.
Figure 6B:
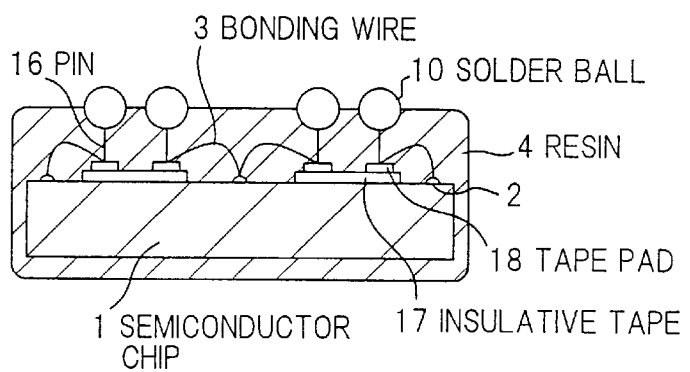

FIGS. 6A and 6B respectively show a perspective view and a cross-sectional view of the second preferred embodiment of the invention, in which an insulative tape is used instead of the leads. In this embodiment, an insulative tape 17, to which conductive tape pads 18 are stuck, is used instead of the insulative resin shaft 7 shown in FIGS. 2A and 2B. As shown in FIG. 6A, the insulative tape 17 is stuck to the semiconductor chip 1, and a bonding wire 3 is bond with the tape pad 18 stuck to the insulative tape 17. A remaining part of a bonding wire 3 is formed into a pin 16, which is nearly vertical to the tape pad 18. Then, the semiconductor chip 1 having the pins 16 and the bonding wires 3 is sealed by sealing resin 4 except the circumferences of the pins 16. Then, solder balls 10 are set at portions corresponding to the pins 16, and joined therewith.

Figure 7:
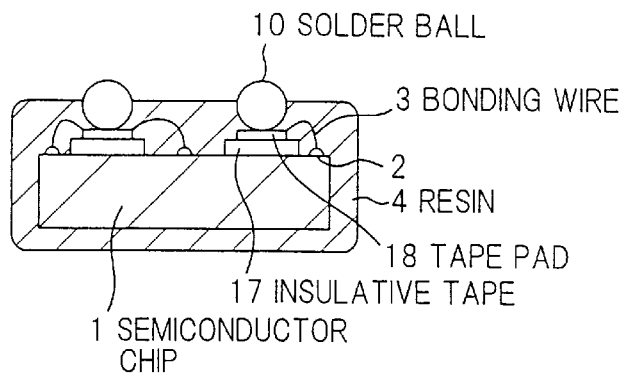

FIG. 7 shows a cross-sectional view of the third preferred embodiment of the invention, in which a tape pad is used instead of the leads. In this embodiment, pins 16, which are shown in FIGS. 6A and 6B, are not used, and solder balls 10 are directly set on a tape bad 18 and joined therewith.

According to the second and third embodiments, it becomes possible to directly connect the bonding wire 3 with the solder ball 10, which serves as an external terminal, without using the lead, by making the insulating tape 17 provided with the tape pad 18 lie between the pad and the solder ball, and miniaturize the semiconductor device.

As mentioned in the above, according to the embodiments of the invention since it become possible to connect the pad formed on the semiconductor chip with the solder ball, which communicates with the external circuit, without using the lead, which has been an obstacle to miniaturization of the conventional semiconductor device, the degree of freedom of bonding increases and the semiconductor device can be miniaturized.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device, comprising:

insulative members partially covered with conductive parts and stuck to a first surface of a semiconductor chip, bonding wires for connecting pads formed on said semiconductor chip with said conductive parts, external terminals connected with said conductive parts; and wherein said insulative members are insulative resin shafts having a longitudinal axis substantially parallel to a plane of the surface, and said conductive parts are solder-plated layers.

2. A semiconductor device, according to claim 1, wherein:

said external terminals are solder balls, and form a ball grid array.

3. A semiconductor devices according to claim 1, wherein:

said semiconductor chip, said bonding wires, said insulative members and said conductive parts are sealed by resin.

4. A semiconductor device, comprising:

a semiconductor chip having a plurality of connecting pads on a first surface of said chip;

an elongated insulative member on the first surface of said chip and having a longitudinal axis substantially parallel to a plane of the first surface, said insulative member having a plurality of spaced apart conductive parts on a surface thereof;

a plurality of bonding wires, each of said bonding wires connecting one of said pads to a respective one of said conductive parts; and a plurality of external terminals, each of said external terminals being connected to a respective one of said conductive parts.

5. The device of claim 4, wherein said insulative member is a cylinder with its longitudinal axis substantially parallel to the plane of the first surface.

6. The device of claim 5, wherein each of said conductive parts comprises an electrically conductive tubular sheath covering a portion of an axial length of said cylinder.

7. The device of claim 6, wherein each of said external terminals comprises a solder ball contacting a respective one of said tubular sheaths.

8. The device of claim 7, wherein each of said solder balls directly contacts said respective tubular sheath.

9. The device of claim 5, wherein said cylinder is supported on the first surface of said chip with plural platforms that separate said cylinder from the first surface.

10. The device of claim 4, wherein said insulative member is a flat ribbon having a planar surface parallel to the plane of the first surface.

11. The device of claim 10, wherein each of said conductive parts comprises an electrically conductive base covering a portion of the planar surface of said ribbon.

12. The device of claim 11, wherein each of said external terminals comprises a solder ball contacting a respective one of said conductive bases.

13. The device of claim 12, wherein each of said solder balls directly contacts said respective conductive base.

14. The device of claim 12, wherein each of said solder balls contacts said respective conductive base through a respective pin extending generally perpendicular to the plane of the first surface.

15. The device of claim 10, wherein said ribbon is directly on the first surface of said chip.

* * * * *